United States Patent
Agarwala et al.

(10) Patent No.: US 6,825,561 B1
(45) Date of Patent: Nov. 30, 2004

(54) STRUCTURE AND METHOD FOR ELIMINATING TIME DEPENDENT DIELECTRIC BREAKDOWN FAILURE OF LOW-K MATERIAL

(75) Inventors: Birendra N. Agarwala, Hopewell Junction, NY (US); Du B. Nguyen, Danbury, CT (US); Hazara S. Rathore, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,273

(22) Filed: Jun. 19, 2003

(51) Int. Cl.$^7$ .......................... H01L 23/48; H01L 23/52
(52) U.S. Cl. ................... 257/752; 257/759; 257/762; 257/774; 438/631; 438/633; 438/634; 438/672; 438/675
(58) Field of Search .................. 438/631, 633, 438/634, 645, 672, 675; 257/752, 759, 762, 774

(56) References Cited

U.S. PATENT DOCUMENTS

| | | | |
|---|---|---|---|
| 5,252,516 A | 10/1993 | Nguyen et al. ............ 437/195 |
| 5,434,451 A | 7/1995 | Dalal et al. ................. 257/768 |
| 5,760,595 A | 6/1998 | Edwards et al. ............ 324/703 |
| 5,976,970 A | 11/1999 | Dalal et al. ................. 438/637 |
| 5,981,374 A | 11/1999 | Dalal et al. ................. 438/624 |
| 6,033,939 A | 3/2000 | Agarwala et al. ........... 438/132 |
| 6,069,068 A | 5/2000 | Rathore et al. ............. 438/628 |
| 6,130,161 A | 10/2000 | Ashley et al. .............. 438/687 |
| 6,133,139 A | 10/2000 | Dalal et al. ................. 438/624 |
| 6,258,710 B1 | 7/2001 | Rathore et al. ............. 438/628 |
| 6,287,954 B1 | 9/2001 | Ashley et al. .............. 438/622 |
| 6,294,835 B1 | 9/2001 | Dalal et al. ................. 357/760 |
| 6,348,731 B1 | 2/2002 | Ashley et al. .............. 257/751 |
| 6,455,443 B1 | 9/2002 | Eckert et al. ............... 438/781 |
| 6,515,367 B1 | 2/2003 | Bernard et al. ............. 257/758 |
| 6,596,627 B2 * | 7/2003 | Mandal ...................... 438/622 |
| 2002/0096778 A1 * | 7/2002 | Cox .......................... 257/774 |

* cited by examiner

Primary Examiner—Hsien Ming Lee
(74) Attorney, Agent, or Firm—Lisa U. Jaklitsch; Cantor Colburn LLP

(57) ABSTRACT

An interconnect structure for a semiconductor device includes a metallization line formed within a low-k dielectric material, the metallization line being surrounded on bottom and side surfaces thereof by a liner material. An embedded dielectric cap is formed over a top surface of the metallization line, wherein the embedded dielectric cap has a sufficient thickness so as to separate a top surface of the liner material from a hardmask layer formed over the low-k dielectric material.

16 Claims, 4 Drawing Sheets

STRUCTURE AND METHOD FOR ELIMINATING TIME DEPENDENT DIELECTRIC BREAKDOWN FAILURE OF LOW-K MATERIAL

BACKGROUND OF INVENTION

The present invention relates generally to semiconductor device processing and, more particularly, to a structure and method for eliminating time dependent dielectric breakdown failure of low-k material.

In the fabrication of integrated circuit devices, it is often desirable to isolate individual components of the integrated circuits from one another with insulative materials. Such insulative materials may include, for example, silicon dioxide, silicon nitride and silicon carbide. While these materials may have acceptable insulating properties in many applications, they also have relatively high dielectric constants, which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance. Thus, for specific applications, insulating materials having relatively low dielectric constants (e.g., k<3) are desired. In very large scale integrated circuit (VLSI) technology, silicon dioxide ($SiO_2$) has been traditionally used as an interlevel dielectric (ILD) material in conjunction with aluminum interconnect material. More recently, significant advancements have been made to enhance circuit performance by replacing the $SiO_2$ with a "low-k" dielectric and by using copper (higher conductivity) interconnect.

Certain organic polymers are known in the semiconductor manufacturing industry for their low-k dielectric properties; these polymers are often used for intermetallic insulation in damascene structures. These polymers are generally classified as aromatic thermosets, polyarylene ethers and crosslinked polyphenylene polymers, including low-k organic and/or non-organic, porous or non-porous dielectric materials. The low-k dielectric is typically applied to semiconductor wafers by spin-on coating in a wafer track, similar to the process used in the application of photolithography resist. Alternatively, it may be deposited by a chemical vapor deposition (CVD) process.

However, the integration of an all low-k dielectric in semiconductor manufacturing has presented several challenges such as, for example, the effects of time dependent dielectric breakdown (TDDB). TDDB has been a substantial reliability concern in the formation of back end of line (BEOL) interconnect structures, when using a low-k dielectric in conjunction with copper metallization. However, the leakage current increases over time to a level sufficient to cause dielectric breakdown, and eventually circuit failure could occur over the lifetime of the device. This mode of failure is substantially absent in case of oxide dielectrics, but is predominant in copper interconnects formed within low-k dielectrics used as interlevel dielectric. Accordingly, it is desirable to be able to utilize a low-k dielectric material with a diffusive metallization material, while also preventing TDDB concerns.

SUMMARY OF INVENTION

The foregoing discussed drawbacks and deficiencies of the prior art are overcome or alleviated by an interconnect structure for a device. A metallization line is formed within a low-k dielectric material, the metallization line being surrounded on bottom and side surfaces thereof by a liner material. An embedded dielectric cap is formed over a top surface of the metallization line, wherein the embedded dielectric cap has a sufficient thickness so as to separate a top surface of the liner material from a hardmask layer formed over the low-k dielectric material.

In another aspect, a back end of line (BEOL) interconnect structure for a semiconductor device includes a trench formed within a low-k dielectric material and a liner material formed within the trench. A metallization line formed within the trench, the metallization line being surrounded on bottom and side surfaces thereof by the liner material. An embedded dielectric cap is formed in the trench and over a top surface of the metallization line, wherein the embedded dielectric cap has a sufficient thickness so as to separate a top surface of the liner material from a hardmask layer formed over the low-k dielectric material.

In still another aspect, a method for forming an interconnect structure includes defining a trench within a low-k dielectric material and forming a liner material within the trench. A conductive metallization material is formed within the trench and over the liner, and a portion of the metallization material and the liner material is removed from the trench. An embedded dielectric cap is formed in the trench and over a top surface of the metallization material and the liner material, wherein the metallization material is surrounded on bottom and side surfaces thereof by the liner material, and surrounded on a top surface thereof by the embedded dielectric cap.

BRIEF DESCRIPTION OF DRAWINGS

Referring to the exemplary drawings wherein like elements are numbered alike in the several Figures.

DETAILED DESCRIPTION

Figure 1:
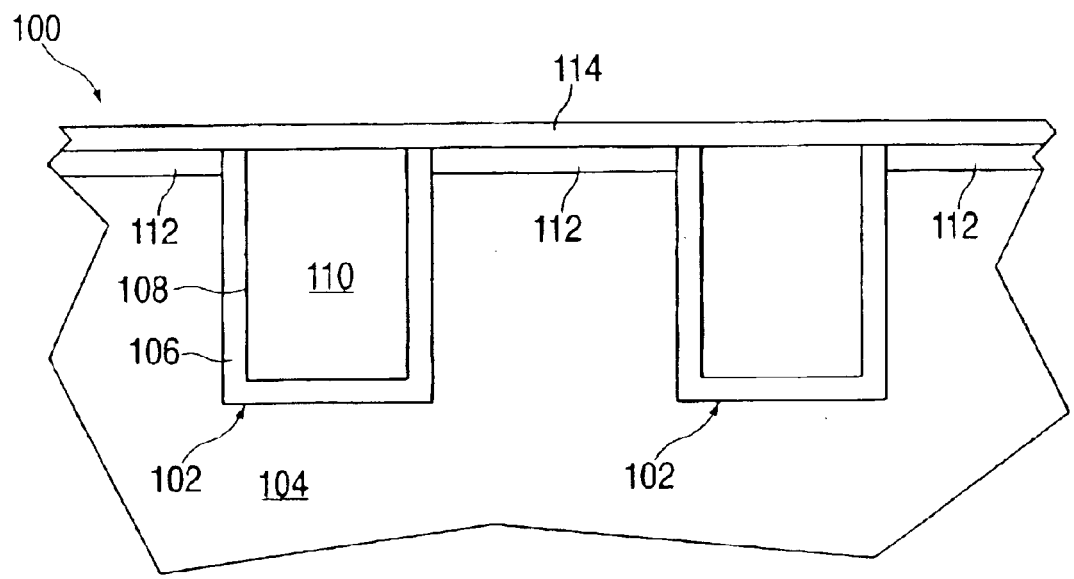
FIG. 1 is a cross sectional view of an existing BEOL interconnect structure featuring copper metallization lines formed within an interlevel dielectric.

Referring initially to FIG. 1, there is shown an existing BEOL interconnect structure 100 featuring an illustrative pair of copper metallization lines formed within a low-k interlevel dielectric. As will be appreciated by those skilled in the art, one or more trenches 102 are initially formed within a low-k interlevel dielectric 104 through the use of standard lithography and reactive etching (RE) processes. The interconnect lines are subsequently formed by a physical vapor deposition (PVD) of a liner material 106 (e.g., a refractory metal such as Tantalum (Ta), Titanium (Ti), Tungsten (W), or other suitable barrier material such as TaN) in the trenches 102, followed by a copper (Cu) seed layer 108. The seed layer 108, generally of copper (Cu), acts as an electrode for subsequent electroplating of the copper line metallization material 110.

As can be seen from FIG. 1, the copper line material 110 is enclosed by the liner 106 on three sides; i.e., the left, right and the bottom surfaces thereof. A hardmask material 112 is used for lithographic definition of subsequently formed trenches, as well as to protect low-k interlevel dielectric (ILD) damage during chemical mechanical polishing (CMP). The hardmask 112 may include, for example, $SiO_2$, silicon nitride (SiN), silicon carbide (SiC), and intersects the lateral top surfaces of the copper line enclosed by the liner 106, while the topmost surface of the copper line 110 is covered by a thin layer of dielectric material 114. The cap material 114 prevents copper diffusion into the surrounding low-k dielectric material 104, as well as to enhance the adhesion between the copper lines and the low-k dielectric.

As stated previously, the TDDB related leakage under the influence of an electric field is believed to be caused by the migration of Cu ions from one line to another. In one respect, there has been a significant advancement in liner coverage in recent years with new processes such as ionized metal plasma (IMP), self-ionized plasma (SIP), and hollow cathode magnetron (HCM) processes. Thus, the sidewall coverage and the integrity of the liner 106 are quite satisfactory given these processes, and as such, the migration of copper directly through the liner barrier is unlikely to occur. On the other hand, the same cannot be said with regard to migration of Cu proximate the top surface of the line, which is in fact believed to be the primary source of the leakage problem. More specifically, the CMP process used to remove excess conductor and liner material may create areas of local damage to the liner 106 at the top of the line such that Cu ions could migrate through the low-k/hardmask interface or directly through the low-k dielectric medium. Alternatively, copper migration could also occur at the interface of the hardmask layer 112 and cap layer 114 at the top of the line. Furthermore, Cu contaminants could be trapped along the hardmask-cap interfaces at specific defect sites created by, for example, scratches generated by the CMP process. The migration of Cu along such interfaces under an electric field can also be a potential source of leakage.

Figure 2:
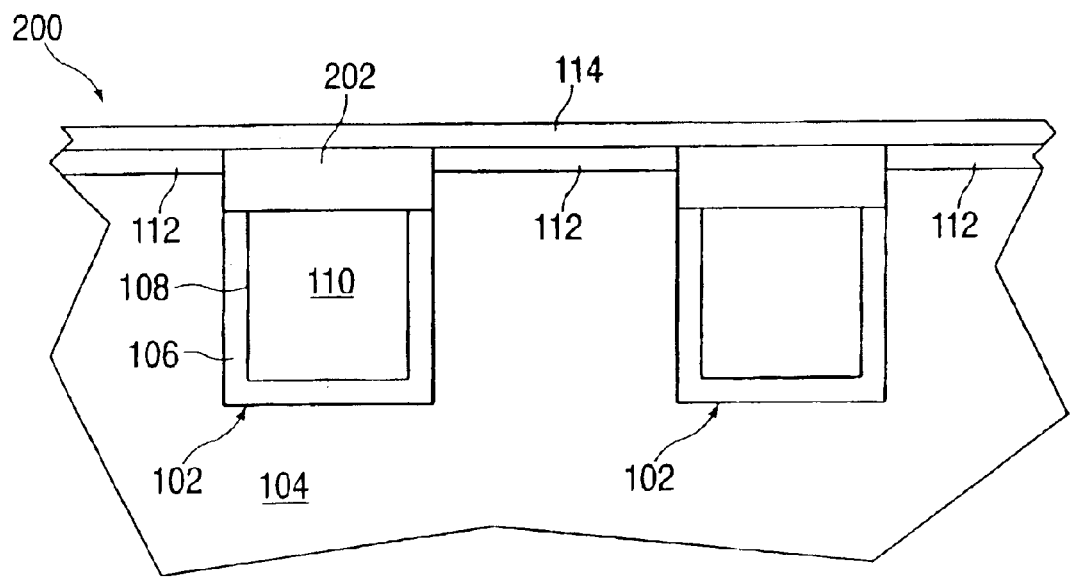
FIG. 2 is a cross sectional view of a novel interconnect structure having an embedded dielectric cap formed over a copper line, in accordance with an embodiment of the invention.
Figure 3A:
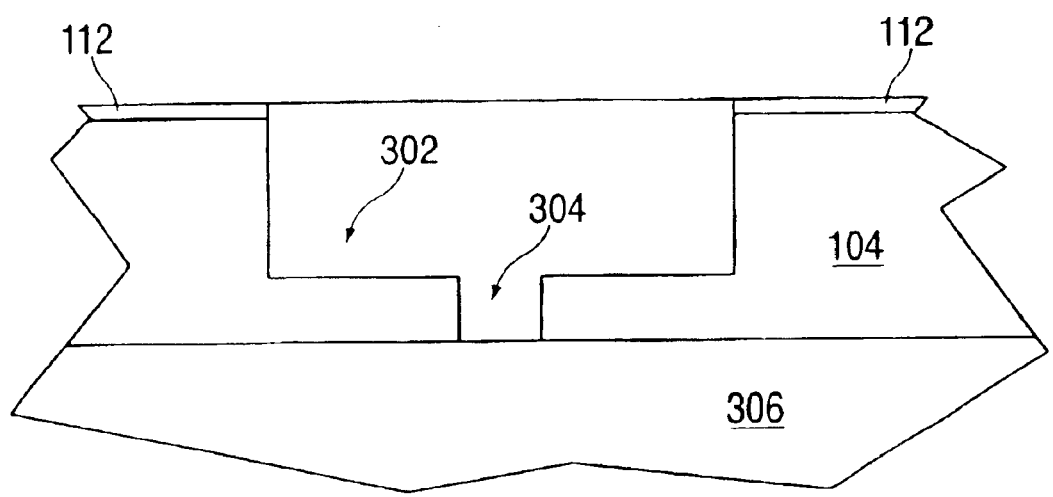
FIGS. 3(a)–3(f) illustrate an exemplary processing sequence used to form an interconnect structure as shown in FIG. 2, in accordance with a further embodiment of the invention.
Figure 3B:
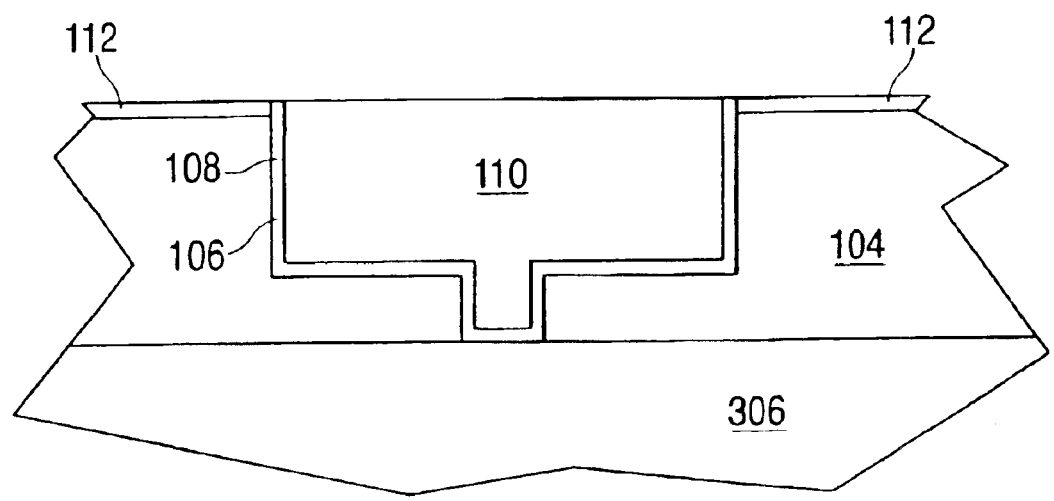
Figure 3C:
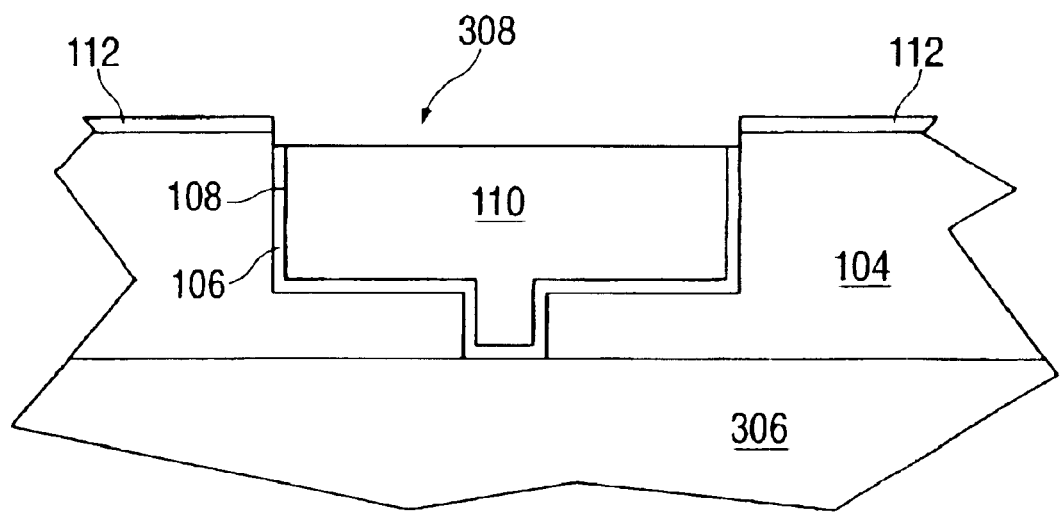
Figure 3D:
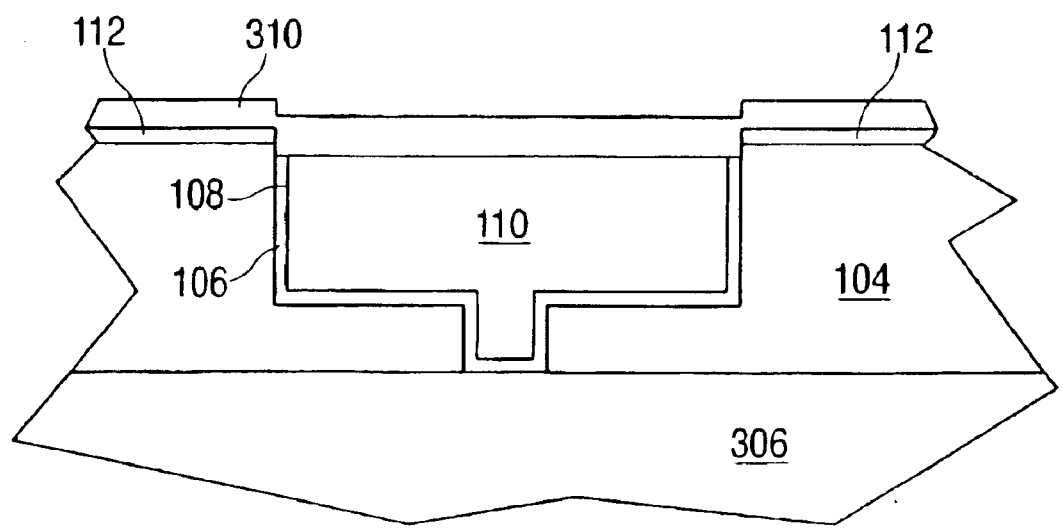
Figure 3E:
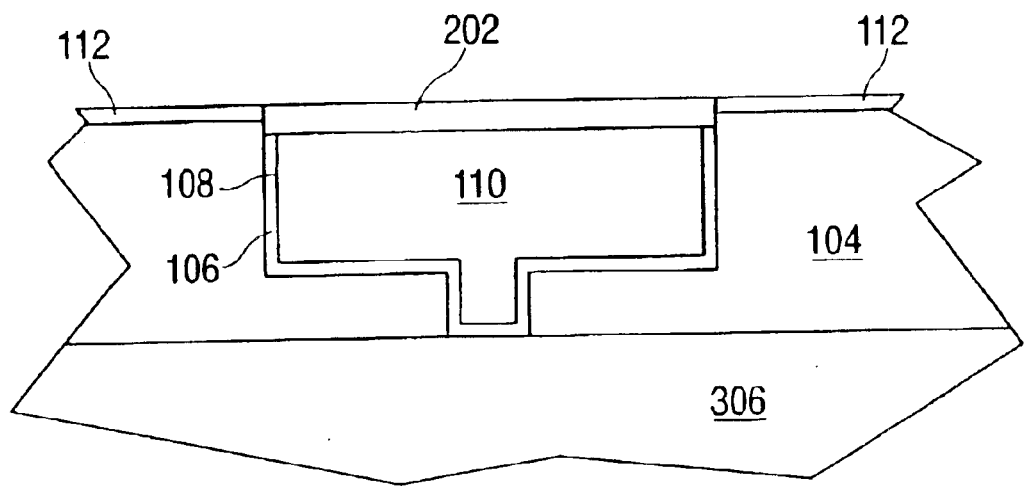
Figure 3F:
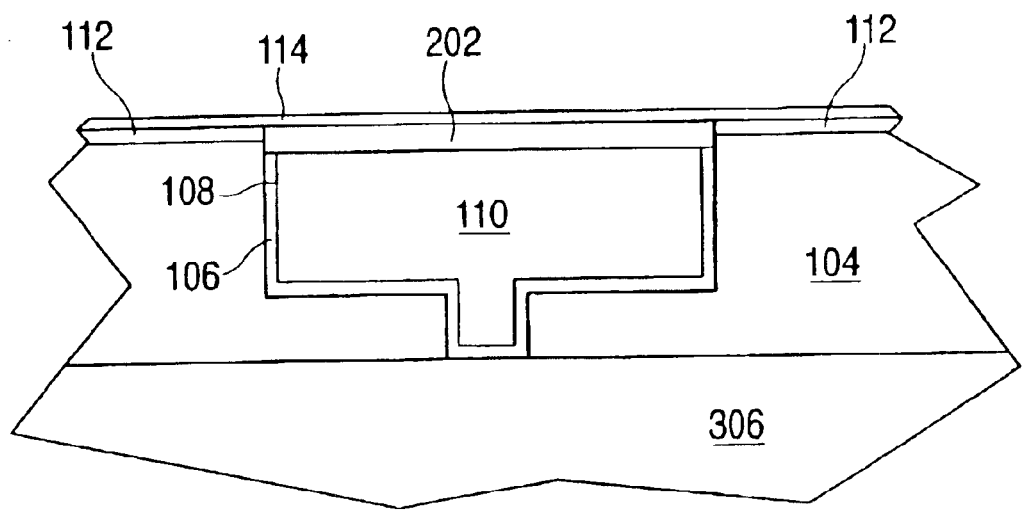

Therefore, in accordance with an embodiment of the invention, FIG. 2 illustrates a novel BEOL interconnect structure 200 which suppresses copper migration at either of the above mentioned interfaces. Briefly stated, the structure 200 features an embedded dielectric cap 202 formed atop the line material, thereby eliminating the migration of copper through the top of the liner 106, as well as through the low-k dielectric/hardmask interface. The embedded cap structure may be achieved by a suitable chemical or RE etching of the copper line material 110 after CMP thereof to form a recessed top copper surface surface. The liner removal in the recessed area is optional; if desired, the liner could be removed by a suitable chemical or RIE process. Subsequently, the embedded dielectric cap 202 can be deposited and then planarized by CMP.

Any suitable material such as High Density Plasma (HDP) Silicon Nitride, Ultraviolet (UV) Silicon Nitride, or Plasma Enhanced CVD (PECVD) Silicon Nitride could be used for the embedded dielectric cap 202. This cap 202 serves to eliminate a leakage current path between the copper metallization and any conductive material embedded as defects on top of the hardmask layer 112 or the ILD 104 due to process induced defects, such as chemical mechanical polishing. The cap 202 also enhances adhesion between the copper lines and a subsequently formed cap layer 114.

After the embedded cap 202 is formed, the existing process steps may then be used to deposit cap layer 114 on the top surface. In the disclosed embodiment, the top of the copper line 110 is covered with the embedded dielectric cap 202, also formed within the trench 102. The thickness of the embedded dielectric cap 202 should be sufficient so as to extend below the level of the hardmask layer 112 by about 200 to about 500 angstroms ($\tilde{A}\square$) In this configuration, the copper material in the line 110 is completely surrounded by the liner 106 on the bottom and side surfaces thereof, and also by the dielectric cap 202 on the top surface thereof. Thus, the migration of copper ions through either the low-k ILD/hardmask interface or the hardmask/cap interface is eliminated. In addition, since there is no electric field present in the vertical direction, the migration of copper ions through the hardmask layer 112 and the embedded dielectric interface at the top of the line 108 is also eliminated.

FIGS. 3($a$) through 3($f$) illustrate an exemplary processing sequence used to form an interconnect structure similar to that shown in FIG. 2, in accordance with a further embodiment of the invention. In particular, FIGS. 3($a$)–3($f$) illustrate the formation of the embedded cap in connection with a dual damascene process of via and line definition.

As shown in FIG. 3($a$), both a line (trench) opening 302 and a via opening 304 are patterned and formed within the low-k ILD material 104 and the hardmask layer 112 atop the ILD 104. It will be appreciated that the embodiment depicted herein may represent any of a number of particular levels of metallization within the semiconductor device. Thus, if the line to be formed in trench opening 302 represents the first metallization level (M1), then the via to be formed within via opening 304 is a contact area (CA) stud, and the area 306 below ILD 104 represents an active area substrate of the device. On the other hand, the trench opening 302 could also represent a higher metallization level, in which case area 306 could then represent a lower metallization level in the device.

FIG. 3($b$) illustrates the device following dual damascene deposition (e.g., by copper plating) and planarization of the liner material 106, seed layer 108 and copper metallization 110. Up to this point, the device has been fabricated in accordance with conventional techniques, with the top of the liner 106 and copper metallization being level with the hardmask layer 112. However, as shown in FIG. 3($c$), a top portion of the line material 110 has been recessed by reactive ion etching (RIE) and/or a suitable chemical etching process to form a trench 308. As indicated previously, the trench 308 extends to a depth of about 200 to about 500 $\tilde{A}\square$ below the bottom of hardmask layer 112. Then, as shown in FIG. 3($d$), an embedded capping material 310 is blanket deposited so as to cover the trench 308.

The capping material 310, as stated above, may be a silicon nitride material deposited by HDP, UV or PECVD techniques, for example. Once deposited, the capping material is then planarized down to the level of the hardmask 112, thereby forming the embedded cap 202. This is shown in FIG. 3($e$). Finally, FIG. 3($f$) illustrates the deposition of the cap layer 114 over the hardmask 112 and newly formed embedded cap 202.

As will be appreciated, the above discussed method and structure provides an embedded dielectric cap located at the top of a metallization line such that the cap extends below the bottom surface of the hardmask, and thus the level of the electric field. As such, the driving force for TDDB and leakage is eliminated across hardmask/cap and hardmask/low-k dielectric interfaces. Again, such interfaces are potential sources of the TDDB problem due to the presence of induced defects, scratches, and metallic contaminants at the interfaces. By removing the presence of an electric field across these interfaces, the concerns of TDDB or leakage failure are effectively-eliminated.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An interconnect structure for a semiconductor device, comprising:
   a metallization line formed within a low-k dielectric material, said metallization line being surrounded on bottom and side surfaces thereof by a liner material;
   a hardmask layer formed over said low-k dielectric material;
   an embedded dielectric cap formed over a top surface of said metallization line, said embedded dielectric cap being planarized down to the level of said hardmask layer; and
   a continuous cap layer, formed over said hardmask layer and the top of said embedded dielectric cap;
   wherein said embedded dielectric cap has a sufficient thickness so as to separate a top surface of said liner material from said hardmask layer.

2. The interconnect structure of claim 1, wherein said metallization line comprises copper.

3. The interconnect structure of claim 1, wherein said embedded dielectric cap is formed at a thickness so as to extend below said hardmask layer by about 200 to about 500 angstroms (Å).

4. The interconnect structure of claim 1, wherein said low-k dielectric material comprises an organic polymer.

5. A back end of line (BEOL) interconnect structure for a semiconductor device, comprising:
   a trench formed within a low-k dielectric material;
   a liner material formed within said trench;
   a metallization line formed within said trench, said metallization line being surrounded on bottom and side surfaces thereof by said liner material;
   a hardmask layer formed over said low-k dielectric material;
   an embedded dielectric cap formed in said trench and over a top surface of said metallization line, said embedded dielectric cap being planarized down to the level of said hardmask layer; and
   a continuous cap layer, formed over said hardmask layer and the top of said embedded dielectric cap;
   wherein said embedded dielectric cap has a sufficient thickness so as to separate a top surface of said liner material from said hardmask layer.

6. The BEOL interconnect structure of claim 5, wherein said metallization line comprises copper.

7. The BEOL interconnect structure of claim 5, wherein said embedded dielectric cap is formed at a thickness so as to extend below said hardmask layer by about 200 to about 500 angstroms (Å).

8. The BEOL interconnect structure of claim 5, wherein said embedded dielectric cap further comprises silicon nitride.

9. The BEOL interconnect structure of claim 5, wherein said low-k dielectric material comprises an organic polymer.

10. A method for forming an interconnect structure, the method comprising:
    defining a trench within a low-k dielectric material, said low-k dielectric material having a hardmask layer formed thereupon;
    forming a liner material within said trench;
    forming a conductive metallization material within said trench and over said liner material;
    removing a portion of said metallization material and said liner material from said trench;
    forming an embedded dielectric cap in said trench and over a top surface of said metallization material and said liner material, said embedded dielectric cap being planarized down to the level of said hardmask layer; and
    forming a continuous cap layer over said hardmask layer and the top of said embedded dielectric cap;
    wherein said metallization material is surrounded on bottom and side surfaces thereof by said liner material, and surrounded on a top surface thereof by said embedded dielectric cap.

11. The method of claim 10, wherein said embedded dielectric cap has a sufficient thickness so as to separate said top surface of said liner material from a hardmask layer formed over said low-k dielectric material.

12. The method of claim 11, wherein said embedded dielectric cap is formed at a thickness so as to extend below said hardmask layer by about 200 to about 500 angstroms (Å).

13. The method of claim 10, wherein said low-k dielectric material comprises an organic polymer.

14. The method of claim 13, wherein said metallization material comprises copper.

15. The method of claim 10, wherein said embedded dielectric cap comprises silicon nitride.

16. The method of claim 15, wherein said embedded dielectric cap is formed by one of: High Density Plasma (HDP) Silicon Nitride deposition, Ultraviolet (UV) Silicon Nitride deposition, and Plasma Enhanced CVD (PECVD) Silicon Nitride deposition.

* * * * *